United States Patent
Shanbhag et al.

(10) Patent No.: US 11,749,671 B2
(45) Date of Patent: Sep. 5, 2023

(54) INTEGRATED CIRCUIT STRUCTURES WITH WELL BOUNDARY DISTAL TO SUBSTRATE MIDPOINT AND METHODS TO FORM THE SAME

(71) Applicant: GLOBALFOUNDRIES U.S. Inc., Santa Clara, CA (US)

(72) Inventors: Kaustubh Shanbhag, Slingerlands, NY (US); Glenn Workman, Austin, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 141 days.

(21) Appl. No.: 17/067,033

(22) Filed: Oct. 9, 2020

(65) Prior Publication Data
US 2022/0115368 A1    Apr. 14, 2022

(51) Int. Cl.
*H01L 27/02* (2006.01)
*H01L 21/8238* (2006.01)
*H01L 21/762* (2006.01)

(52) U.S. Cl.
CPC ...... *H01L 27/0207* (2013.01); *H01L 21/7624* (2013.01); *H01L 21/823892* (2013.01)

(58) Field of Classification Search
CPC ............. H01L 27/0207; H01L 21/7624; H01L 21/823892
See application file for complete search history.

(56) References Cited

U.S. PATENT DOCUMENTS

| | | | | |
|---|---|---|---|---|
| 7,314,788 | B2* | 1/2008 | Shaw | H01L 27/11807 257/E21.135 |
| 7,342,287 | B2* | 3/2008 | Chuang | H01L 21/84 257/350 |
| 8,410,549 | B2* | 4/2013 | Bulucea | H01L 29/0847 257/E29.279 |
| 9,092,590 | B2* | 7/2015 | Giraud | G06F 30/39 |
| 10,043,826 | B1* | 8/2018 | Li | H01L 21/26513 |
| 10,909,298 | B1* | 2/2021 | Chan | H01L 27/0207 |
| 11,201,215 | B2* | 12/2021 | Han | H01L 29/78603 |
| 11,315,942 | B2* | 4/2022 | Tang | H01L 29/40117 |

(Continued)

OTHER PUBLICATIONS

M. Jagadesh Kumar, "Two-Dimensional Analytical Modeling of Fully Depleted DMG SOI MOSFET and Evidence for Diminished SCEs," IEEE Transactions on Electron Devices, vol. 51, No. 4, Apr. 2004, 6 pages.

(Continued)

*Primary Examiner* — Bac H Au
(74) *Attorney, Agent, or Firm* — Anthony Canale; Hoffman Warnick LLC

(57) ABSTRACT

The disclosure provides integrated circuit (IC) structures and methods to form the same. Methods according to the disclosure may be performed on a substrate having a first doping type, the substrate extending between a first end and a second end. A deep well is formed within the substrate, the deep well including a well boundary defined between the deep well and a remainder of the substrate. The well boundary is horizontally distal to a midpoint between the first end and the second end of the substrate. A first active semiconductor region is formed at least partially over the substrate, and an oppositely-doped second active semiconductor region is formed at least partially over the deep well.

18 Claims, 8 Drawing Sheets

(56) References Cited

U.S. PATENT DOCUMENTS

| | | | | |
|---|---|---|---|---|
| 11,329,129 | B2* | 5/2022 | Block | H01L 27/0207 |
| 2002/0135022 | A1* | 9/2002 | Igaue | H01L 21/823892 |
| | | | | 257/E21.644 |
| 2006/0022270 | A1* | 2/2006 | Boyd | H01L 29/78609 |
| | | | | 257/E21.415 |
| 2006/0231899 | A1* | 10/2006 | Chang | H01L 27/1203 |
| | | | | 257/E27.099 |
| 2007/0132033 | A1* | 6/2007 | Wu | H01L 21/823892 |
| | | | | 257/500 |
| 2009/0003105 | A1* | 1/2009 | Itoh | G11C 11/4097 |
| | | | | 257/296 |
| 2012/0146149 | A1* | 6/2012 | Momiyama | H01L 27/092 |
| | | | | 257/351 |
| 2013/0089978 | A1* | 4/2013 | Noel | H01L 29/78648 |
| | | | | 438/622 |
| 2013/0178043 | A1* | 7/2013 | Cheng | H01L 27/1087 |
| | | | | 257/E21.214 |
| 2016/0079277 | A1* | 3/2016 | Hook | H01L 27/092 |
| | | | | 438/154 |
| 2020/0176463 | A1* | 6/2020 | Tang | G11C 16/0466 |
| 2020/0335502 | A1* | 10/2020 | Mohan | H01L 21/823892 |
| 2022/0037369 | A1* | 2/2022 | Tang | H01L 29/40117 |
| 2022/0115368 | A1* | 4/2022 | Shanbhag | H01L 21/823892 |

OTHER PUBLICATIONS

Jean-Philippe Noel et al., "Multi-Vτ UTBB FDSOI Device Architectures for Low-Power CMOS Circuit," IEEE Transactions on Electron Devices, vol. 58, No. 8, Aug. 2011, 10 pages.

Chang-yong Zheng, "The Using of Dual-Material Gate MOSFET in Suppressing Short-Channel Effects: A Review," IEEE 2011, 4 pages.

Ryu et al., "Transistor Layout Optimization for Leakage Saving," ISOCC 2013, IEEE downloaded from IEEE Xplore on Sep. 23, 2020, 2 pages.

L. Grenouillet et al., "Ground Plane Optimization for 20nm FDSOI Transistors with Thin Buried Oxide," IEEE 2012, downloaded from IEEE Xplore on Sep. 23, 2020, 2 pages.

Taco et al., "Exploring back biasing opportunities in 28nm UTBB FD-SOI technology for subthreshold digital design," 2014 IEEE 28-th Convention of Electrical and Electronics Engineers in Israel, 4 pages.

* cited by examiner

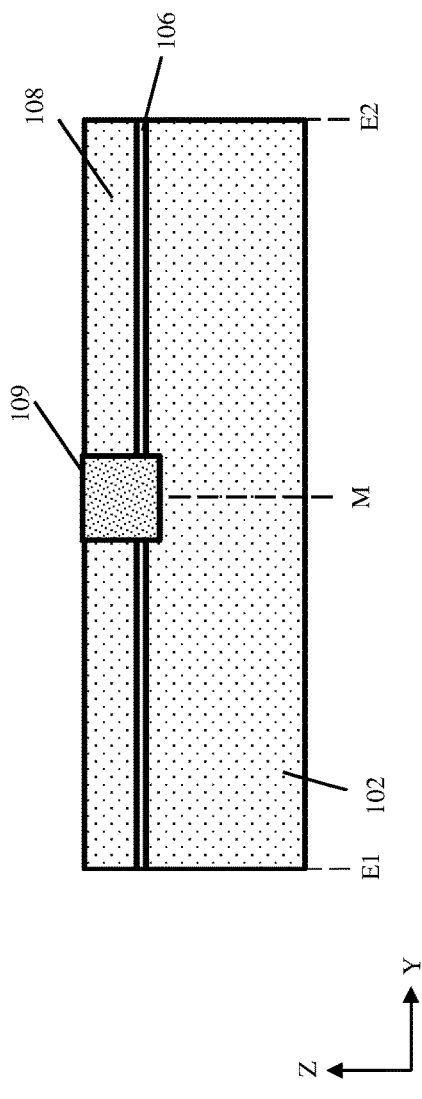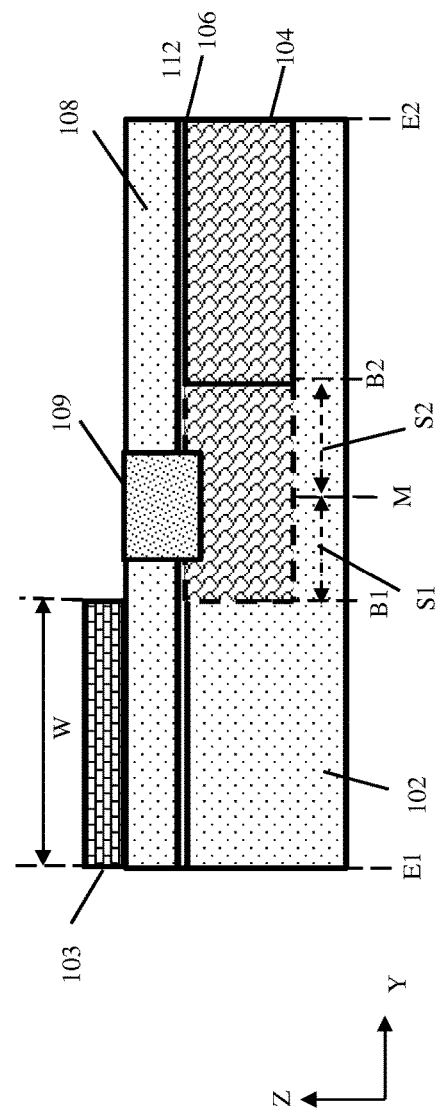

INTEGRATED CIRCUIT STRUCTURES WITH WELL BOUNDARY DISTAL TO SUBSTRATE MIDPOINT AND METHODS TO FORM THE SAME

TECHNICAL FIELD

Embodiments of the disclosure relate generally to integrated circuits (ICs) and related methods. More specifically, embodiments of the disclosure provide ICs with a well boundary distal to the midpoint of a substrate, and methods to form the same.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost, at the penalty of increasing leakage currents. Present technology is at nanometer-level scaling of certain micro-devices such as logic gates, field effect transistors (FETs), and capacitors. Circuit chips with millions of such devices are common.

Standard cells, or other standardized cell layouts for logic, may form part of an integrated circuit to implement prescribed digital logic features and configurations, e.g., used for automatic placement and routing. Using known configurations of transistors to implement various logic gate structures, the device layer of a product may be separated into individual cells where the transistors may be formed. During operation, the body of the transistor (or back gate in the case of SOI technologies) is electrically biased, e.g., to control the threshold voltage of particular transistors in a device. The layout and position of elements within a standard cell may be chosen to manage leakage currents, parasitic resistances and/or capacitances, and/or other electrical properties of a device. Conventional approaches for reducing current leakage within a standard cell may negatively affect other attributes of a cell, e.g., the frequency at which logic signals may be processed. Further alternatives for managing such attributes may be limited by the fundamental concepts of a standard cell, e.g., providing a uniform layout to implement various logic functions.

SUMMARY

Aspects of the disclosure provide a method of forming an integrated circuit (IC) structure, the method including: forming a deep well within a substrate having a first doping type and extending between a first end and a second end, the deep well including a well boundary defined between the deep well and a remainder of the substrate, the well boundary being horizontally distal to a midpoint between the first end and the second end of the substrate; forming a first active semiconductor region of the first doping type at least partially over the substrate; and forming a second active semiconductor region of a second doping type at least partially over the deep well, wherein the second doping type is opposite the first doping type.

Further aspects of the disclosure provide an integrated circuit (IC) structure including: a substrate having a first doping type; a deep well within the substrate, the deep well having a second doping type opposite the first doping type, wherein an interface between the substrate and the deep well defines a well boundary within the substrate; a first active semiconductor region over the substrate and the deep well, the first active semiconductor region having the first doping type, wherein the first active semiconductor region includes a first end over the substrate and a second end over the deep well such that the well boundary is vertically aligned with a bottom surface of the first active semiconductor region; and a second active semiconductor region over the deep well, the second active semiconductor region having the second doping type, wherein the second active semiconductor region is horizontally distal to the well boundary.

Additional aspects of the disclosure provide an integrated circuit (IC) structure including: a substrate having a first doping type; a deep well within the substrate, having a second doping type opposite the first doping type, wherein an interface between the substrate and the deep well defines a well boundary within the substrate; a first active semiconductor region over the substrate and the deep well, and having the first doping type, wherein the first active semiconductor region is horizontally distal to the well boundary; and a second active semiconductor region over the deep well, the second active semiconductor region having the second doping type, wherein the second active semiconductor region includes a first end over the substrate and a second end over the deep well, such that the well boundary is vertically aligned with a bottom surface of the second active semiconductor region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 3 forming a semiconductor material to separate adjacent transistors according to embodiments of the disclosure.

FIG. 4 depicts a cross-sectional view of forming a deep well according to embodiments of the disclosure.

Figure 1:
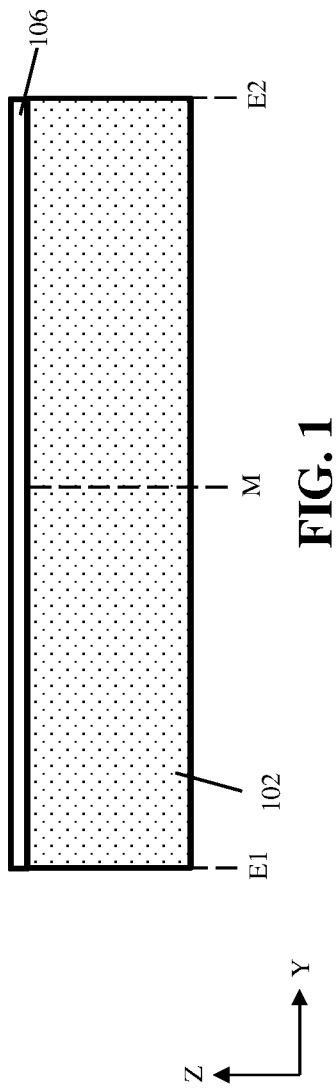
FIG. 1 depicts cross sectional view of a substrate with a thin insulator film according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to integrated circuit (IC) structures with a well boundary distal to the midpoint of the substrate of the IC structure. Such IC structures may be integrated into one or more logic cells, and may be formed and/or structured to reduce current leakages that would otherwise arise from the structure and/or functions that are implemented in a portion of a device. In many devices, it may be desirable to form an electrical connection to the body region of a transistor, e.g., to provide a body voltage to the transistor. Such biasing of a transistor may influence the threshold voltage (i.e., the voltage magnitude needed to allow or prevent currents through the channel) of the transistor during operation. Embodiments of the disclosure provide an IC structure with a substrate and deep well in the substrate, in which the boundary between the substrate and deep well is horizontally distal to a midpoint of the substrate (e.g., relative to horizontal boundaries of the cell). Active semiconductor regions may be formed over the substrate and/or deep well, and one of the active semiconductor regions may be located over portions of the both the substrate and the deep well. Embodiments of the disclosure are operable to provide logic cells with reduced leakage and improved operational reliability for certain applications, and without significantly affecting the position and arrangement of nearby logic cells. Methods of the disclosure may include forming the deep well to have the well boundary that is horizontally offset from the midpoint of the substrate, based on a desired current leakage profile.

As an example, the drawings and/or process flows accompanying the IC structure according to the embodiments of the disclosure are based upon Silicon on Insulator technology (e.g., fully depleted SOI ("FDSOI")). However, the embodiments of the disclosure are valid for conventional Bulk technologies with a substrate and a finite well boundary on which active transistors may be constructed.

FIG. 1 depicts a preliminary structure 100, capable of being processed in methods according to the disclosure. The methods described herein may yield an IC structure according to one or more embodiments of the disclosure. Preliminary structure 100 may represent part of an initial material distributed across a two-dimensional area in plane X-Y, and FIG. 1 illustrates a cross-section of preliminary structure 100 in the Y-Z plane. Preliminary structure 100 may include a substrate 102 of semiconductor material, which may be the base material on/within which further materials (e.g., variously doped well regions, transistor structures, insulator regions, and/or other electrical components of a device) are formed. The substrate material may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Substrate 102 may extend horizontally within the X-Y plane, and as shown may have a first horizontal end E1 and a second horizontal end E2 in the Y direction. Horizontal ends E1, E2 may represent the physical edges of substrate 102, and/or only the portions that make up preliminary structure 100 (e.g., the area targeted for logic cell formation and/or subjected to methods according the disclosure). A midpoint M may be halfway between horizontal ends E1, E2 of substrate 102. Areas of substrate 102 may be defined with respect to horizontal end(s) E1, E2 and midpoint M as discussed herein.

The disclosure may include forming the foundational components for transistors. Embodiments of the disclosure may include forming an insulator film 106 over substrate

102. Insulator film 106 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. In some cases, the thickness of insulator film 106 can be controlled (e.g., limited to a thickness of five nm or up to approximately fifty nm) to provide the foundation of a fully depleted semiconductor on insulator (FDSOI) structure. The use of FDSOI technology, where applicable, provides various advantages such as increased adjustability of electric potential within the body region of a transistor.

Figure 2:
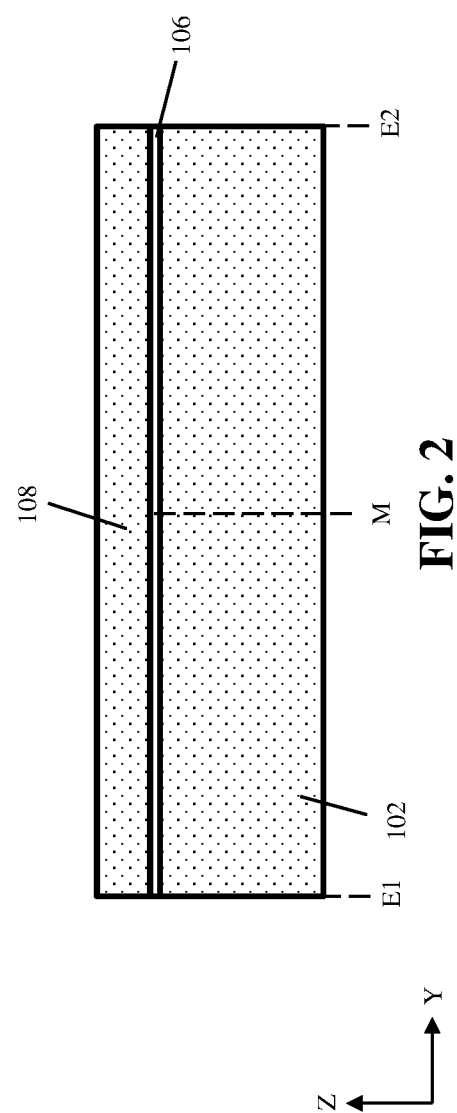
FIG. 2 depicts a cross-sectional view of forming a semiconductor material on the insulator film according to embodiments of the structure.

As shown in FIG. 2, Further processing may include forming a semiconductor layer 108 (e.g., an FDSOI layer of a thickness of five nanometers (nm) to approximately twenty nm) above substrate 102, and on top of insulator film 106 where applicable. Semiconductor layer 108 may include one or more semiconductor materials described herein with respect to substrate 102, and may have the same composition as substrate 102 or a distinct semiconductor material.

Referring to FIG. 3, continued processing may include forming insulative materials and/or converting portions of semiconductor layer 108 into electrical separation materials for distinguishing between different transistors and/or transistor types. To isolate adjacent transistors to be constructed on the semiconductor layer 108, portions of semiconductor layer 108 may be replaced with an isolation region 109. Isolation region 109 may take the form of, e.g., a shallow trench isolation (STI), region of other insulative material, and/or non-conductive derivative material (e.g., amorphous silicon) by any currently known or later developed silicon conversion technique. In the case of an insulative material, isolation region 109 may have the same composition as insulator film 106 and/or may include other insulator materials. Regardless of the process(es) and/or materials used, at least one isolation region 109 may be used within semiconductor layer 108 and may also replace portions of substrate 102 and/or insulator region 106. In further examples, isolation region 109 may overlie insulator region 106.

Turning to FIG. 4, various portions of substrate 102 may be doped, based on the intended polarity and/or function of transistors and/or other device structures formed thereon, to form a deep well 104. Where applicable, insulator film 106 may partially electrically insulate substrate 102 and deep well 104 from semiconductor layer 108, while allowing voltage biases applied to substrate 102 and/or deep well 104 to influence semiconductor layer 108. Subsequent various active elements on semiconductor layer 108, such that substrate 102 and deep well 104 are operable to electrically bias and/or influence current flow through semiconductor layer 108 (e.g., by affecting the threshold voltage of a transistor) without fundamentally changing the function of active elements.

A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask 103 (e.g., a film of photoresist material and/or other component to block dopants) in place so that only certain areas of the substrate will be doped. A width W of mask 103 may control the size of deep well(s) 104 formed from doping. In the example of doping by implantation, an ion implanter may be employed. In further examples, in-situ doping or other doping techniques may be used.

Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. Doped portions of a substrate may be known in the art as a "well." A well commonly refers to the implanted/diffused region in semiconductor wafer needed to implement complementary metal oxide semiconductor (CMOS) cell. A "deep well" refers to doped semiconductor material located underneath active device components and/or other wells. Depending on the attributes of a device to be manufactured, deep well 104 may be either n-type or p-type doped.

Embodiments of the disclosure may include introducing dopants into portions of substrate 102 to form deep well 104. Deep well 104 may have a first doping type (e.g., P or N type doping). In the case where substrate 102 is lightly doped P type, deep well 104 may have N type doping as a first doping type or vice versa. Deep well 104 may extend vertically from an uppermost surface of substrate 102 to a depth that is less than the entire vertical height of substrate 102 on the Z-axis. Deep well 104 may be formed to have a variety of horizontal widths within substrate 102, and FIG. 2 depicts deep well 104 with a particular width, with optional portions of deep well 104 being indicated by phantom lines. However formed, deep well 104 may include a well boundary B1 defined between deep well 104 and a remainder of substrate 102. Well boundary B1 may be horizontally distal to midpoint M between first end E1 and second end E2 of substrate 102. A separation distance S1 may indicate the physical separation between well boundary B1 and midpoint M. Although deep well 104 is shown by example to extend across most of the horizontal width of substrate 102, this may not be true in all implementations. Deep well 104 may be formed to occupy less than half of the horizontal width of substrate 102 in other implementations, and such an example is indicated with solid lines in FIG. 4. Here, well boundary B2 nonetheless may be horizontally distal to midpoint M of substrate 102, and separated by a separation distance S2. Separation distance S1 or S2 may vary based on the intended electrical behavior of the overlying active components. In general, larger separation distances S1, S2 will have a greater effect on current leakage in overlying transistors. Separation distances S1, S2 thus may be as low as, e.g., thirty nanometers (nm) or may be up to ten micrometers (μm) or more. In any case, the placement and dimensionality of deep well 104 and well boundary B1, B2 will influence the electrical behavior of subsequently formed wells, active elements, etc.

Figure 5:
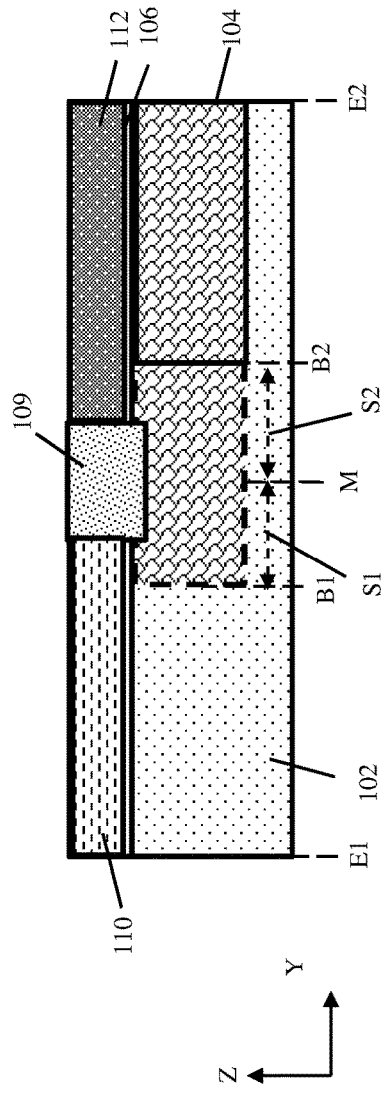
FIG. 5 depicts a cross-sectional view of forming active semiconductor regions over the substrate and deep well according to embodiments of the disclosure.

FIG. 5 depicts a process to convert portions of semiconductor layer 108 into active regions for a transistor. Such regions may include a first active semiconductor region 110 and a second active semiconductor region 112, each being located over respective portions of substrate 102. A remaining portion of isolation region 109 may remain intact between active semiconductor regions 110, 112 to provide physical and electrical separation between the active materials. Active semiconductor regions 110, 112 may be formed, e.g., by any currently known or later developed process to introduce dopants, including a repeated implementation of the process(es) used to form deep well 104. According to an example, first active semiconductor region 110 may have the first doping type and thus may have the same polarity as deep well 104 (e.g., both doped N-type). Second active semiconductor region 112 may have a second doping type that is opposite deep well 104 and/or first active semiconductor region 110 (e.g., doped P-type). First active semiconductor region 110 and second active semiconductor region 112 may have opposite polarity doping to provide a complementary metal oxide semiconductor (CMOS) structure.

Regardless of polarity, the dopant concentration in first active semiconductor region 110 and second active semiconductor region 112 may be adjusted to attain a desired drive current behavior in transistors formed thereon. In some cases, active semiconductor region(s) 110, 112 may have a higher dopant concentration than substrate 102 and/or deep well 104. Active semiconductor regions 110, 112 may be formed with the aid of one or more masks (not shown), similar to deep well 104. As noted by the phantom portion of deep well 104, first active semiconductor region 110 may be located partially over deep well 104 in cases where deep well 104 extends beyond midpoint M of substrate 102 (i.e., well boundary B1 is used). In this case, well boundary B1 is vertically aligned with a bottom surface of first active semiconductor region 110. Alternatively, first active semiconductor region 110 may be entirely over substrate 102 and horizontally displaced from deep well 104 in cases where deep well 104 is less than half of the width of substrate 102 (i.e., well boundary B2 is present). Second active semiconductor region 112 may be over deep well 104 and partially over substrate 102 in cases where deep well 104 is less than half of the width of substrate 102 (i.e., well boundary B2 is present). In this case, well boundary B2 is vertically aligned with a bottom surface of first active semiconductor region 112.

Figure 6:
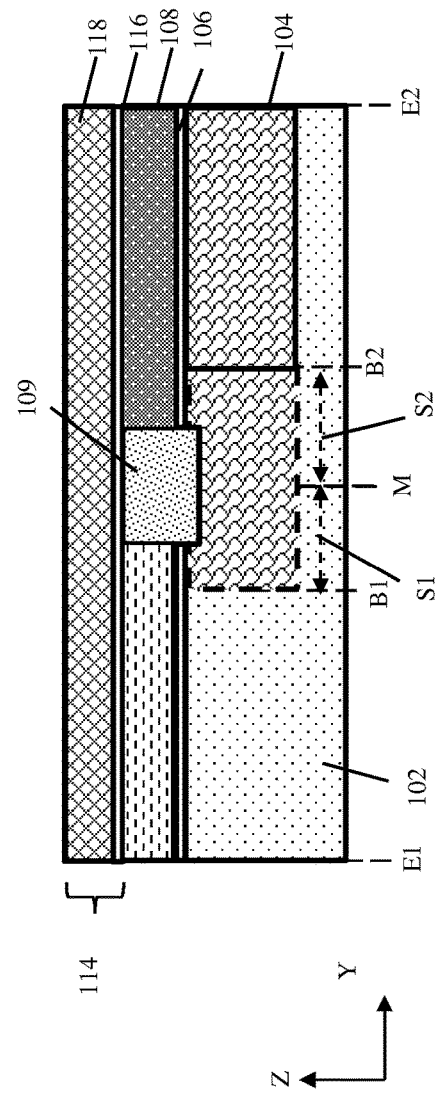
FIG. 6 depicts a cross-sectional view of forming a gate structure according to embodiments of the disclosure.

Referring to FIG. 6, embodiments of the disclosure may include forming remaining transistor elements on first active semiconductor region 110 and second active semiconductor region 112. In the case of a logic cell or other standardized layout for a device layer, some elements (e.g., transistor gates) may be formed over both of first active semiconductor region 110 and second active semiconductor region 112. Embodiments of the disclosure may include forming a gate structure 114 on remaining portions of isolation region 109, and active semiconductor regions 110, 112. The forming of gate structure 114 may include forming a gate dielectric layer 116. Gate dielectric layer 116 may include a high-k dielectric, such as, but not limited to: metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate dielectric layer 116 may include any conceivable insulating material, such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) $[(CH_3)_2SiO]_4$ 2.7 available from Air Liquide, etc., or other low dielectric constant (k<3.9) material, or combinations thereof. Gate dielectric layer 116 may also include high-k dielectric materials, such as, but not limited to, hafnium silicate (HfSiO), zirconium silicate ($ZrSiO_x$), silicon oxynitride (SiON), or any combination of these materials.

The forming of gate structure 114 may also include forming a gate body 118 over gate dielectric layer 116. Gate body 118 may be formed of polycrystalline silicon or an amorphous silicon, and thus may be a "dummy gate" material for removal and replacement in subsequent processing. In other implementations, gate body 118 may include one or more metals (e.g., one or more high work function metals) suitable to provide a gate contact for a transistor. Gate body 118 may be formed from doped or undoped polycrystalline silicon (poly-Si) according to one example. In further examples, gate body 118 may include materials such as, but not limited to, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), tungsten (W), tungsten nitride (WN), tungsten carbide (WC), and/or combinations thereof. In the case of a functional gate, applying a voltage to gate body 118 may put underlying semiconductor material in an operational state, e.g., allowing charge carriers to flow within first active semiconductor region 110 and/or second active semiconductor region 112. Gate dielectric layer 116 and gate body 118 together and/or separately may include one or more layers, potentially forming a gate stack. Various insulating materials (e.g., spacers) may be included within and/or formed on sidewalls of gate structure 114, but such materials are omitted from FIG. 4 and subsequent FIGS. solely for clarity of illustration. After forming gate structure 114 over active semiconductor regions 110, 112, fabrication process(es) involving source/drain diffusion regions (e.g., over active regions 110 and 112), may be used to create low resistance paths between the active region of the transistor under the gate region and the S/D metal contacts and/or via. The forming of diffusion regions is known in the art and thus omitted from the accompanying figures. Various processes described herein may yield an integrated circuit (IC) structure 120 according to embodiments of the disclosure.

Figure 7:
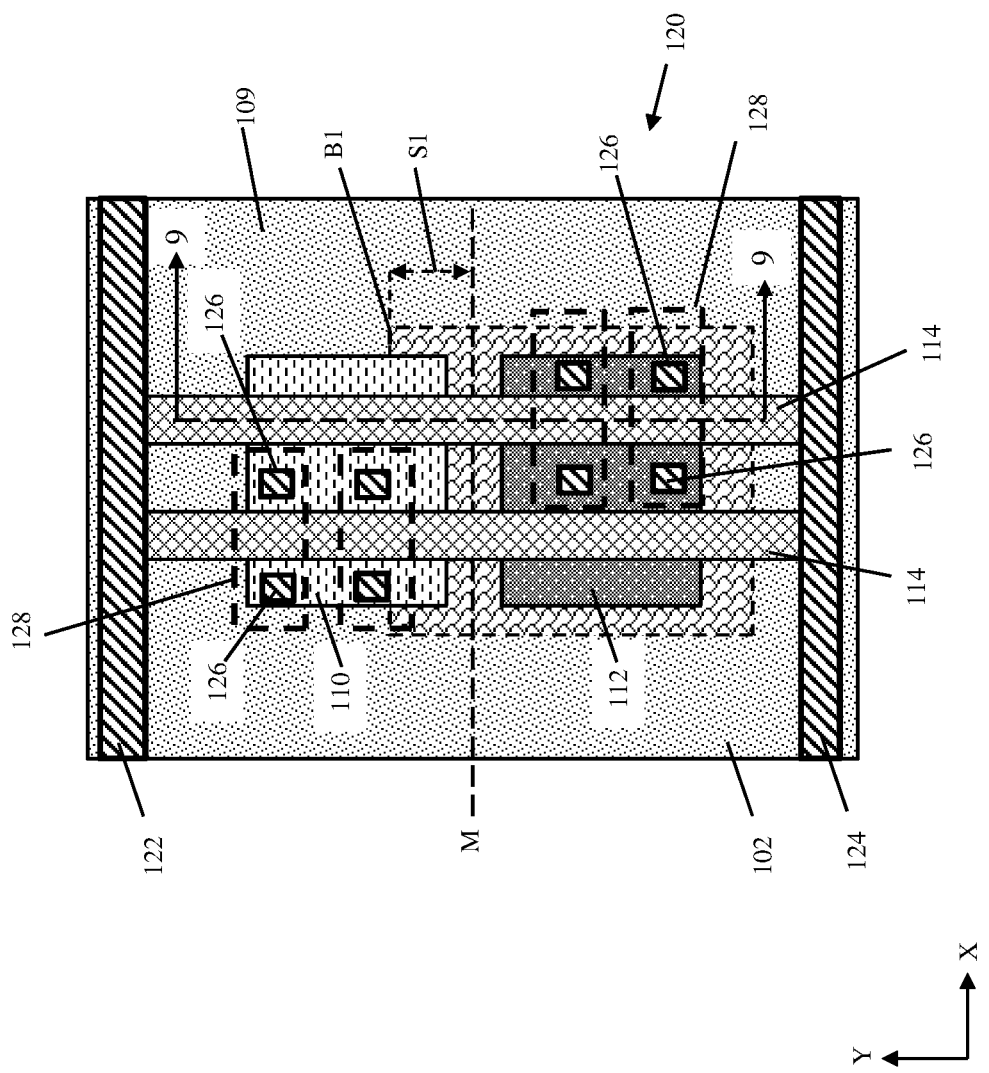
FIG. 7 depicts a plan view of an IC structure according to embodiments of the disclosure.
Figure 8:
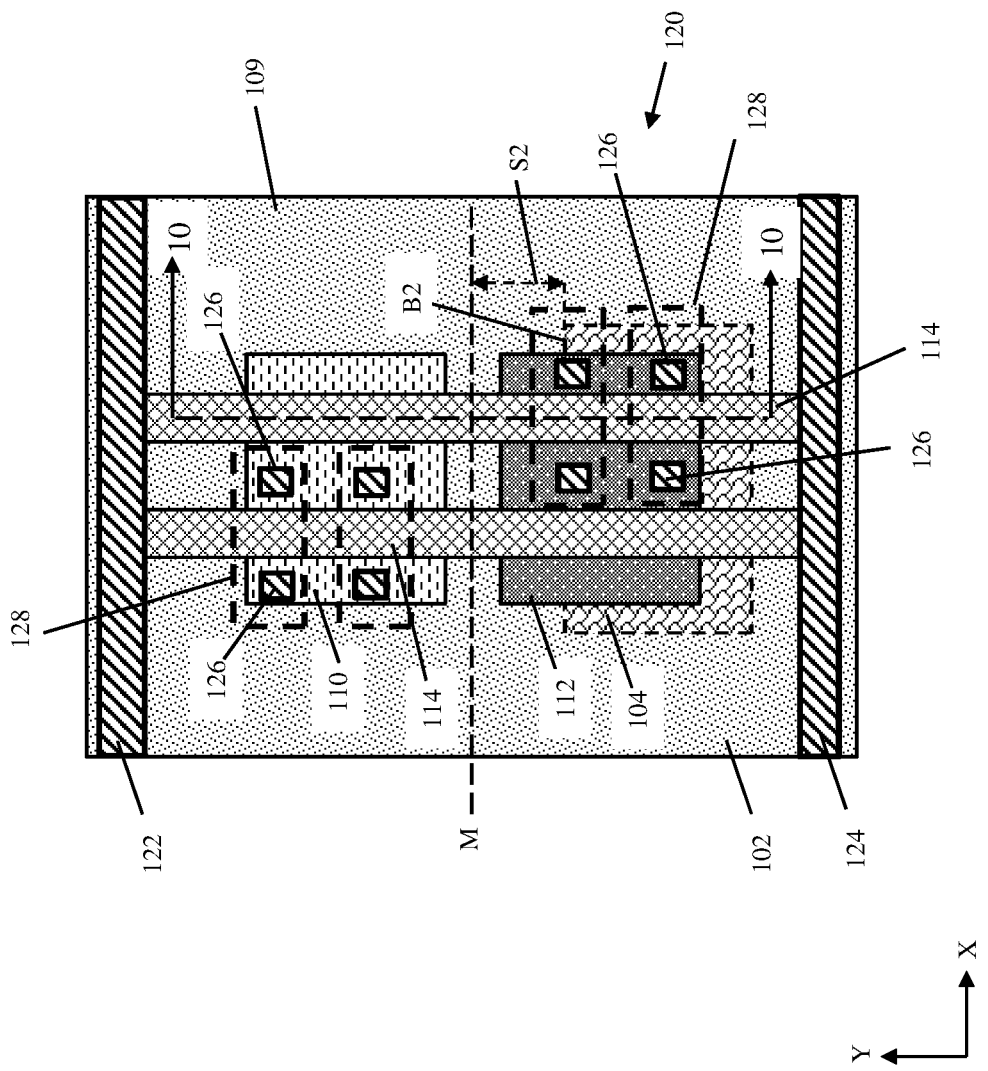
FIG. 8 depicts a plan view of an IC structure according to further embodiments of the disclosure.

Referring now to FIGS. 7 and 8, depicting IC structure 120 in alternative configurations, methods of the disclosure may include forming additional materials, components, etc., to provide a logic cell or other device layout. The various components discussed herein, including substrate 102, deep well 104, and active semiconductor regions 110, 112, may provide the foundational elements for defining various electrical functions, logical operations, etc. In the plan view of FIGS. 7 and 8, deep well 104 is shown in phantom to denote its position underneath active semiconductor regions 110 and 112, and isolation region 109. FIG. 7 depicts a configuration in which deep well 104 is beneath portions of each active semiconductor region 110, 112, while FIG. 8 depicts a configuration in which deep well 104 is only partially beneath second active semiconductor region 112. As discussed herein, the size of deep well 104 may affect current leakage of various transistors on IC structure 120.

The forming of IC structure 120 may include, e.g., forming a power rail 122 on semiconductor layer 108 and/or isolation region 109, and adjacent one end of gate structure 114. Power rail 122 may include one or more conductive metals (e.g., copper (Cu), aluminum (Al), silver (Ag), gold (Au), etc.) capable of delivering electric current to gate structure 114 from a power source and/or other electrically interconnected component. The forming of IC structure 120 may also include forming, e.g., a grounding rail 124 adjacent a second end of gate structure 120, opposite power rail 122. Grounding rail 124 may also include one or more conductive materials, and may be electrically connected to ground or any other component for dissipating electrical energy from gate structure 120. Power rail 122 and grounding rail 124 each may be formed, e.g., by deposition and/or any other conceivable process to form conductive materials on semiconductor layer 108 and/or isolation region 109. Thus, gate structure 114 of IC structure 120 may provide a pathway from power rail 122 to grounding rail 124. In a logic cell or other standardized device layout, various components may be formed within active semiconductor regions 110, 112 to implement distinct functions, without varying the size, shape, location, etc., of semiconductor layer 108, active semiconductor regions 110, 112, power rail 122, and/or grounding rail 124.

Several source/drain (S/D) contacts 126 may be formed to first active semiconductor region 110 and/or second semiconductor region 112, on opposite sides of gate structure 114. Each pair of S/D contacts 126, and gate structure 114, may provide a transistor 128 to implement various logical functions, e.g., by applying a voltage to gate structure 114 to enable to disable current flow through active semiconductor region(s) 110, 112. S/D contacts 126 may extend vertically above IC structure 120 to overlying metal wires and/or vias, and may be formed by deposition of conductive materials. In some cases, S/D contacts 126 may be formed simultaneously with power rail 122 and/or grounding rail 124, and may include the same or similar conductive materials. Transistors 128 may be arranged across IC structure 120 to perform various electrical and/or logical functions, e.g., voltage inverters, AND gates, OR gates, exclusive AND ("XAND") gates, exclusive or ("XOR") gates, negative AND ("NAND") gates, negative OR ("NOR") gates, etc. Thus, the arrangement of transistors 128 shown by example in FIGS. 5 and 6 is just one of a variety of possible arrangements for transistors 128. Embodiments of IC structure 120 differ from conventional logic cells and/or circuit layouts by varying the size of deep well 104 to control current leakage across transistor(s) 128, as discussed herein.

Figure 9:
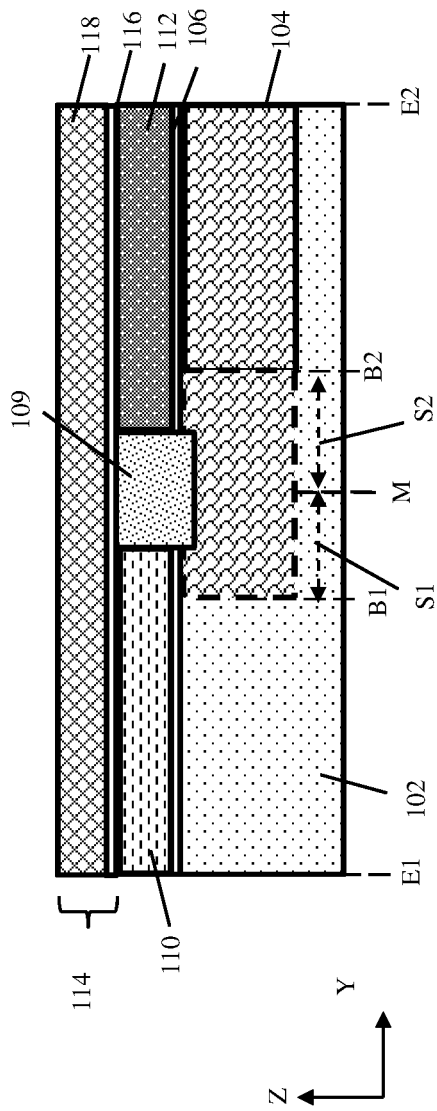
FIG. 9 depicts a cross-sectional view along line 9-9 of FIG. 5 of an IC structure according to embodiments of the disclosure.
Figure 10:
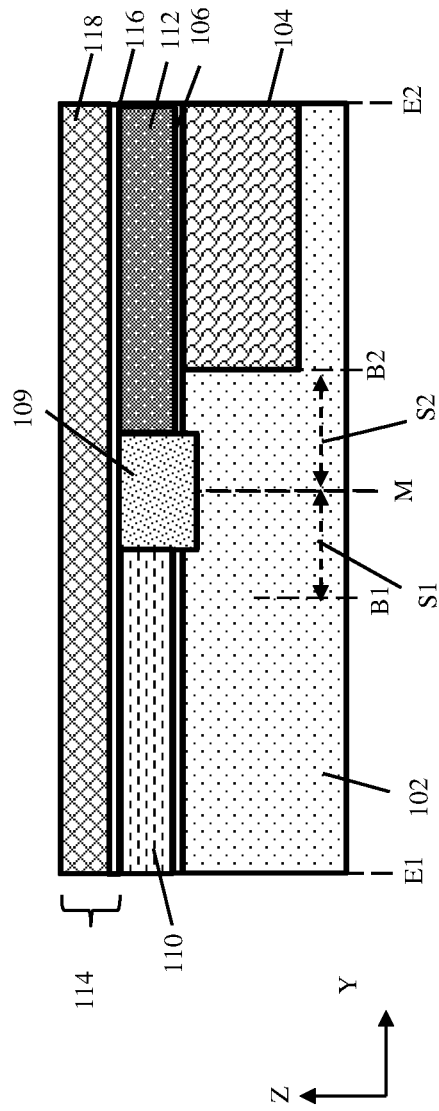
FIG. 10 depicts a cross-sectional view along line 10-10 of FIG. 6 of an IC structure according to further embodiments of the disclosure.

Referring now to FIGS. 9 and 10, controlling the size of deep well 104 may provide distinct structural features within IC structure 120. FIG. 9 depicts an example cross-section of IC structure 120 where well boundary B1 is below first active semiconductor region 110. FIG. 10 depicts an example cross-section of IC structure 120 where well boundary B2 is below second active semiconductor region 112. In the case where deep well 104 extends horizontally across a majority of substrate 102 (i.e., well boundary B1 is present as shown in FIG. 9), a horizontal end of deep well 104 may be vertically below first active semiconductor region 110, and horizontally between opposite horizontal ends of first active semiconductor region 110. In the case where deep well 104 extends horizontally across less than half of substrate 102 (i.e., well boundary B2 is present as shown in FIG. 8), a horizontal end of deep well 104 may be vertically below second active semiconductor region 112, and horizontally between opposite horizontal ends of second active semiconductor region 112.

Figure 11:
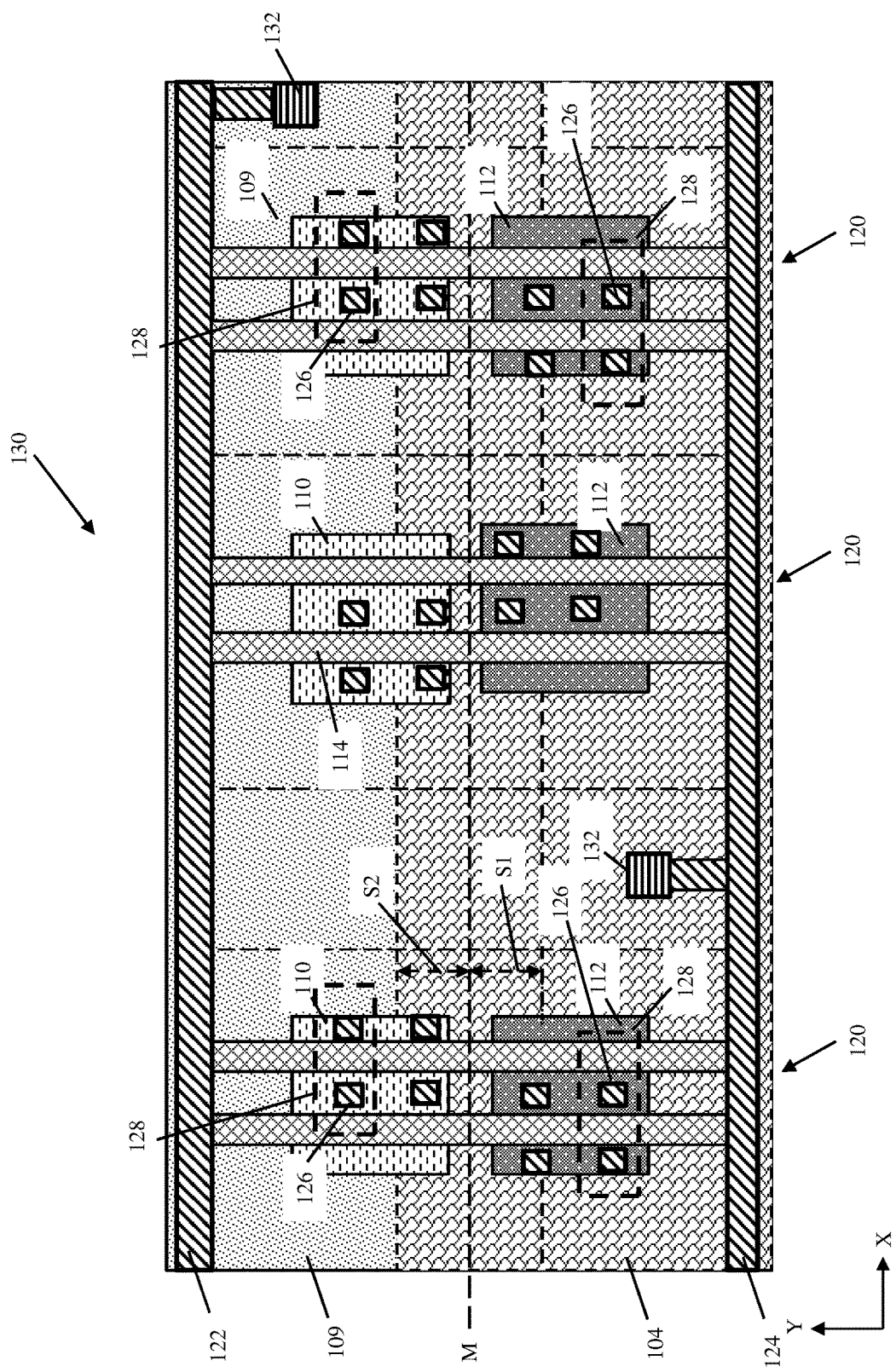
FIG. 11 depicts a plan view of a logic cell including multiple IC structures according to embodiments of the disclosure.

Turning to FIG. 11, embodiments of the disclosure may include a logic cell 130 including multiple IC structures 120 therein. IC structures 120 may be interconnected through power rail 122, grounding rail 124, and overlying wires or vias (not shown) to implement various logical functions (e.g., combinations of fundamental logic such as and, or, not, etc.) IC structures 120 of logic cell 130 may be arranged in a row, and additional rows of IC structures 120 may also be included in logic cell 130 at other locations. However arranged, a single row of IC structures 120 may include substrate 102 and deep well 104 therein, with deep well 104 including well boundary B1 or B2 at a location that is distal to midpoint M of substrate 102. In the case of an FDSOI structure, logic cell 130 may include further components for controlling the operation of transistors 128 within logic cell 130. For example, one or more body contacts 132 may be formed on substrate 102 and/or deep well 104, and electrically coupled to power rail 122 or grounding rail 124. Each body contact 132 may be configured to electrically bias portions of substrate 102 or deep well 104 beneath IC structure(s) 120, but may be horizontally separated from the location of transistor(s) 128. Although one row of three IC structure(s) 120 is shown by example to be included within logic cell 130, it is understood that logic cell 130 may include hundreds or even thousands of IC structures 120 arranged in distinct rows. In this case, each row and/or a particular region of the IC structure within a row, may have a different well boundary B1, B2 between substrate 102 and deep well 104.

Figure 12:
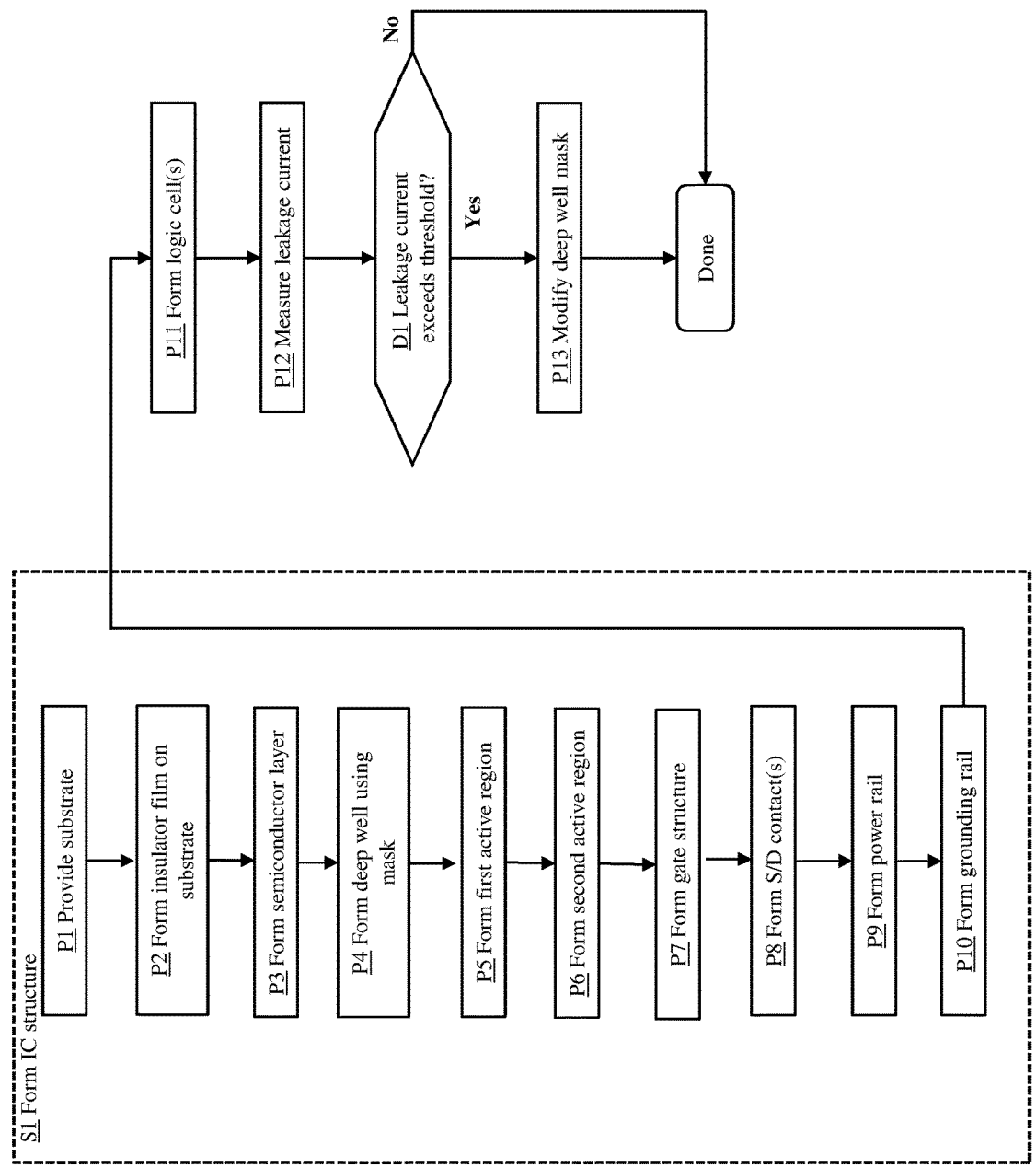
FIG. 12 provides an illustrative flow diagram of methods to form an IC structure according to embodiments of the disclosure.

Referring to FIGS. 7-10 and 12, in which FIG. 12 provides an illustrative flow diagram of operational methodologies to form IC structure 120, and/or logic cell 130, methods according to the disclosure are discussed in further detail. The various processes and ordering shown in FIG. 12 provide just one example, and it is understood that the order of processes, sub-processes, etc., may be altered or that several processes may be implemented simultaneously, implemented with additional processes, and/or omitted entirely. Methods according to the disclosure may include a first operation S1 of forming IC structure 120. Operation S1 may include, as discussed herein, process P1 of providing substrate 102 and process P2 of insulator film 106 on substrate 102 as shown in FIG. 1. Process P3 includes formation of semiconductor layer 108 along with adjacent transistor separation governed by isolation region 109 depicted in FIGS. 2 and 3. Process P4 includes the formation of deep well 104 of a selected width W with the aid of mask 103 (FIG. 4) to determine the size of deep well 104. Depending on the size and shape of mask 103, deep well 104 may occupy a majority or a minority of the width of substrate 102.

As discussed herein, first active semiconductor region 110 may be formed in semiconductor layer 108 at process P5, and second active semiconductor region 112 may be formed in semiconductor layer 110 at process P6 (both depicted in FIG. 3). As shown in FIG. 4, gate structure 114 may be formed in process P7 via forming of gate dielectric 116 and gate body 118 on semiconductor layer 108 and active semiconductor regions 110, 112.

Remaining processes of operation Si may include, e.g., forming S/D contact(s) 126 on active semiconductor regions 110, 112 where transistors 128 are included in a layout to implement various functions. Additionally, process P9 may include forming power rail 122 and process P10 may include forming grounding rail 124. Each of processes P8, P9, P10 may be implemented by deposition of metal(s) and/or other conductive materials, and these processes may be implemented together or separately as desired. Several IC structure(s) 120 may be formed, e.g., as shown in operation S1, to provide one or more logic cells 130 in process P11. Logic cells 130 may be included as digital circuitry within an electrical device to implement various functions. At process P12, a user and/or tester of logic cell 130 may apply a test current to IC structure(s) 120 to measure the leakage current across one or more transistors 128 therein.

Methods according to the disclosure are operable to determine whether well boundary B1, B2 between substrate 102 and deep well 104 should be modified in subsequent processing. At decision D1, a user or tester can evaluate whether the leakage current of IC structure(s) 120 exceed a threshold (e.g., a maximum allowable current loss across transistor(s) 128). In cases where the leakage current exceeds the threshold (i.e., "Yes" at decision D1), the method may continue to process P13 of modifying mask 103 for subsequent deep well formation. The modifying of mask 103 may include increasing or reducing width W to change the size of deep well 104, depending on the intended operation and/or polarity of transistors 128 with excessive leakage current. In some instances, the adjusting of mask 103 may include causing deep well 104 to go from occupying a majority of substrate 102 to a minority of substrate 102, or vice versa. After the modifying of mask 103 in process P12, or in cases where the leakage current does not exceed the threshold (i.e., "No" at decision D1), the method may conclude, ("Done").

Embodiments of the disclosure may include various technical or commercial advantages, some of which are discussed herein as examples. In conventional fabrication of logic cells, a deep well is formed to occupy approximately half the width of a substrate to provide equal surface area for complementary transistor cells formed thereover. Embodiments of the disclosure, however, account for current leakage in a fabricated device by varying the boundary between the substrate and deep well. This may be particularly advantageous for FDSOI devices, e.g., due to the effects of body biasing on the threshold voltage and/or other operational properties of overlying transistors. Moreover, embodiments of the disclosure can manage the current leakage in transistors of a logic cell without fundamentally changing the shape and/or layout of transistors and/or other active components within the logic cell. Methods according to the disclosure also allow for future units, devices, etc., to be modified to prevent future units from exhibiting significant leakage currents.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The structure and method as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
forming a deep well within a substrate, the substrate having a first doping type and the deep well having a second doping type opposite the first doping type, wherein the deep well extends between a first end and a second end and includes a well boundary defined between the deep well and a remainder of the substrate, the well boundary being horizontally distal to a midpoint between the first end and the second end of the substrate;
forming a first active semiconductor region of the second doping type at least partially over the substrate;
forming a second active semiconductor region of the first doping type at least partially over the deep well, wherein the second active semiconductor region is horizontally distal to the well boundary;
forming a gate structure over the first active semiconductor region and the second active semiconductor region;
forming a power rail adjacent a first end of the gate structure; and
forming a grounding rail adjacent a second end of the gate structure, opposite the power rail.

2. The method of claim 1, further comprising:
forming a set of source/drain (S/D) contacts within the first active semiconductor region or the second active semiconductor region.

3. The method of claim 2, further comprising forming an insulator film on the substrate, wherein the first active semiconductor region and the second active semiconductor region each define portions of a fully depleted semiconductor on insulator (FDSOI) region.

4. The method of claim 2, further comprising forming a plurality of logic cells over the substrate and the deep well, wherein each of the plurality of logic cells includes the deep well with the well boundary horizontally distal to the midpoint between the first end and the second end of the substrate.

5. The method of claim 2, further comprising:
measuring a leakage current across the set of S/D contacts; and
for subsequent deep well formation, modifying a mask used to form the deep well to change a location of the well boundary based on the measured leakage current.

6. The method of claim 1, wherein the first doping type is N-type doping, the second doping type is P-type doping, and forming the first active semiconductor region and the second active semiconductor region includes doping the first active semiconductor region and the second active semiconductor region to have distinct doping concentrations with respect to the deep well.

7. The method of claim 1, wherein the well boundary is vertically aligned with a bottom surface of the first active semiconductor region.

8. An integrated circuit (IC) structure comprising:
a substrate having a first doping type;
a deep well within the substrate, the deep well having a second doping type opposite the first doping type, wherein an interface between the substrate and the deep well defines a well boundary within the substrate;
a first active semiconductor region over the substrate and the deep well, the first active semiconductor region having the second doping type, wherein the first active semiconductor region includes a first end over the substrate and a second end over the deep well such that the well boundary is vertically aligned with a bottom surface of the first active semiconductor region;
a second active semiconductor region over the deep well, the second active semiconductor region having the first doping type, wherein the second active semiconductor region is horizontally distal to the well boundary;
a gate structure over the first active semiconductor region and the second active semiconductor region;
a power rail adjacent a first end of the gate structure; and
a grounding rail adjacent a second end of the gate structure.

9. The IC structure of claim 8, further comprising an insulator film vertically between the substrate and each of the first active semiconductor region and the second active semiconductor region, wherein the first active semiconductor region and the second active semiconductor region each define portions of a fully depleted semiconductor on insulator (FDSOI) region.

10. The IC structure of claim 8, wherein the first active semiconductor region, the second active semiconductor region, the gate structure, the power rail, and the grounding rail each comprise portions of a logic cell.

11. The IC structure of claim 10, further comprising a body contact adjacent to the logic cell, wherein the body contact is configured to electrically bias the substrate or the deep well.

12. The IC structure of claim 8, wherein the first doping type is N-type doping, the second doping type is P-type doping, and wherein a dopant concentration of the first active semiconductor region and the second active semiconductor region is greater than a dopant concentration of the deep well.

13. An integrated circuit (IC) structure comprising:
a substrate having a first doping type;
a deep well within the substrate, having a second doping type opposite the first doping type, wherein an interface between the substrate and the deep well defines a well boundary within the substrate;
a first active semiconductor region over the substrate, the first active semiconductor region having the second doping type, wherein the first active semiconductor region is horizontally distal to the well boundary; and
a second active semiconductor region over the substrate and the deep well, the second active semiconductor region having the first doping type, wherein the second active semiconductor region includes a first end over the substrate and a second end over the deep well, such that the well boundary is vertically aligned with a bottom surface of the second active semiconductor region.

14. The IC structure of claim 13, further comprising:
a gate structure over the first active semiconductor region and the second active semiconductor region;
a power rail adjacent a first end of the gate structure; and
a grounding rail adjacent a second end of the gate structure.

15. The IC structure of claim 14, further comprising an insulator film vertically between the substrate and each of the first active semiconductor region and the second active semiconductor region, wherein the first active semiconductor region and the second active semiconductor region each define portions of a fully depleted semiconductor on insulator (FDSOI) region.

16. The IC structure of claim 14, wherein the first active semiconductor region, the second active semiconductor region, the gate structure, the power rail, and the grounding rail each comprise portions of a logic cell.

17. The IC structure of claim 16, further comprising a body contact adjacent to the logic cell, wherein the body contact is configured to electrically bias the substrate or the deep well.

18. The IC structure of claim 13, wherein the first doping type is N-type doping, the second doping type is P-type doping, and wherein a dopant concentration of the first active semiconductor region and the second active semiconductor region is greater than a dopant concentration of the deep well.

\* \* \* \* \*

UNITED STATES PATENT AND TRADEMARK OFFICE
CERTIFICATE OF CORRECTION

| | | |
|---|---|---|
| PATENT NO. | : 11,749,671 B2 | Page 1 of 1 |
| APPLICATION NO. | : 17/067033 | |
| DATED | : September 5, 2023 | |
| INVENTOR(S) | : Kaustubh Shanbhag et al. | |

It is certified that error appears in the above-identified patent and that said Letters Patent is hereby corrected as shown below:

In the Specification

In Column 11, Line 1 reads "Remaining processes of operation Si may include..." but it should read "Remaining processes of operation S1 may include..."

Signed and Sealed this
Twenty-fourth Day of October, 2023

Katherine Kelly Vidal
*Director of the United States Patent and Trademark Office*